(12) United States Patent
Kusumi et al.

(10) Patent No.: US 10,796,655 B2
(45) Date of Patent: Oct. 6, 2020

(54) DISPLAY DEVICE

(71) Applicant: SHARP KABUSHIKI KAISHA, Sakai, Osaka (JP)

(72) Inventors: Takatsugu Kusumi, Sakai (JP); Takuya Watanabe, Sakai (JP); Akira Tagawa, Sakai (JP); Yasuaki Iwase, Sakai (JP); Yohei Takeuchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 33 days.

(21) Appl. No.: 16/234,347

(22) Filed: Dec. 27, 2018

(65) Prior Publication Data

US 2019/0244577 A1 Aug. 8, 2019

(30) Foreign Application Priority Data

Feb. 6, 2018 (JP) .................................. 2018-018762

(51) Int. Cl.
*G09G 3/36* (2006.01)
*G02F 1/1368* (2006.01)
*H01L 27/12* (2006.01)

(52) U.S. Cl.
CPC ......... *G09G 3/3677* (2013.01); *G09G 3/3696* (2013.01); *G02F 1/1368* (2013.01); *G02F 2202/10* (2013.01); *G09G 2310/0251* (2013.01); *G09G 2310/0286* (2013.01); *G09G 2310/08* (2013.01); *G09G 2320/0247* (2013.01); *H01L 27/1225* (2013.01)

(58) Field of Classification Search
CPC ............................ G09G 3/3677; G09G 3/3696

USPC ................................. 345/76, 204, 211, 213
See application file for complete search history.

(56) References Cited

U.S. PATENT DOCUMENTS

| 7,124,041 | B1* | 10/2006 | Johnson | G05B 9/02 |
| | | | | 702/58 |
| 2008/0100566 | A1* | 5/2008 | Miyasaka | G09G 3/3446 |
| | | | | 345/107 |
| 2009/0079495 | A1* | 3/2009 | Morita | H02M 3/07 |
| | | | | 327/538 |
| 2010/0194793 | A1* | 8/2010 | Uehara | G09G 3/20 |
| | | | | 345/691 |
| 2011/0063275 | A1* | 3/2011 | Imamura | G09G 3/3233 |
| | | | | 345/211 |
| 2012/0154365 | A1* | 6/2012 | Yamauchi | G09G 3/3659 |
| | | | | 345/211 |
| 2012/0218245 | A1* | 8/2012 | Morii | G09G 3/3677 |
| | | | | 345/211 |

(Continued)

FOREIGN PATENT DOCUMENTS

WO 2014/061574 A1 4/2014

*Primary Examiner* — Prabodh M Dharia
(74) *Attorney, Agent, or Firm* — ScienBiziP, P.C.

(57) ABSTRACT

A configuration in which a voltage (a gate on voltage) of only one system is used as a voltage for turning scanning lines to a selected state is employed (single power supply system configuration). A unit circuit that constitutes a shift register within a gate driver includes a thin film transistor whose source terminal is connected to an output control node. In such a configuration, when the external power supply is stopped, a voltage supplied to a gate terminal of the thin film transistor and a voltage supplied to a drain terminal of the thin film transistor are set to the gate on voltage.

7 Claims, 15 Drawing Sheets

(56) References Cited

U.S. PATENT DOCUMENTS

| | | | |
|---|---|---|---|
| 2015/0138183 A1* | 5/2015 | Kishi | G09G 3/3291 |
| | | | 345/214 |
| 2015/0269900 A1 | 9/2015 | Iwamoto et al. | |
| 2016/0163264 A1* | 6/2016 | Nishimura | G09G 3/3266 |
| | | | 345/212 |
| 2016/0284867 A1* | 9/2016 | Suzumura | H01L 29/78693 |
| 2020/0135136 A1* | 4/2020 | Nishimura | G09G 3/3677 |

* cited by examiner

VIRTUAL POWER OFF

VIRTUAL POWER OFF

DISPLAY DEVICE

BACKGROUND OF THE INVENTION

1. Field of the Invention

The present invention relates to a display device, and in particular to processing when external power supply is stopped.

2. Description of Related Art

In general, an active matrix-type liquid crystal display device includes a liquid crystal layer and a liquid crystal panel constituted by two substrates that hold the liquid crystal layer. One of the two substrates is provided with a plurality of scanning lines, a plurality of data lines, and a plurality of pixel formation portions arranged in a matrix so as to correspond to respective intersections between the plurality of scanning lines and the plurality of data lines. Each of the pixel formation portions includes a thin film transistor (TFT) whose gate terminal is connected to a scanning line that passes a corresponding intersection and whose source terminal is connected to a data line that passes the same intersection, a pixel capacitance to which a data signal that is transmitted via the data line is to be written, and the like. Further, a common electrode that is common to the plurality of pixel formation portions is provided typically on the other of the two substrates. The active matrix-type liquid crystal display device further includes a gate driver (scanning line drive circuit) that drives the plurality of scanning lines and a source driver (data line drive circuit) that drives the plurality of data lines.

As described above, while data signals are transmitted via the data lines, each of the data lines is not able to transmit data signals for more than one row at one time (simultaneously). Accordingly, writing of data signals to the pixel capacitances in the pixel formation portions is performed sequentially row by row. Therefore, the gate driver is configured by a shift register including a plurality of stages, so that the plurality of scanning lines are selected sequentially for a predetermined period.

Conventionally, in many cases, the gate driver is mounted, as an integrated circuit (IC) chip, on the periphery of substrates constituting a liquid crystal panel. However, in recent years, providing a gate driver directly on a substrate has been gradually increasing. Such a gate driver is called a "monolithic gate driver".

Further, in recent years, development of a liquid crystal panel using a TFT having a channel layer made of indium gallium zinc oxide which is one type of oxide semiconductor (hereinafter referred to as "IGZO-TFT") has been conducted actively. Hereinafter, a liquid crystal panel using an IGZO-TFT is referred to as an IGZO-TFT liquid crystal panel. Also regarding the IGZO-TFT liquid crystal panel, development of a monolithic gate driver is conducted. Hereinafter, a monolithic gate driver provided in the IGZO-TFT liquid crystal panel is referred to as an "IGZO-GDM".

In such a liquid crystal display device described above, there is a case in which a screen is not immediately cleared and an image like a residual image remains even after a user turns the power off. This is because when power supply to the device stops, a discharge path for an electric charge held in a pixel capacitance is blocked, and a residual charge is accumulated within a pixel formation portion. Further, if the device is turned on in a state in which a residual charge is accumulated within the pixel formation portion, display defect such as flicker may occur due to an unevenness of impurities based on the residual charge. Therefore, there is known a technique with which electric charges within a panel are discharged by applying a black voltage to data lines while all of the scanning lines are in a selected state when power supply is stopped.

However, in a case in which an IGZO-TFT liquid crystal panel is employed, electric charges often remain within a panel. This will be explained below. FIG. 20 shows Vg-Id characteristics of an a-SiTFT (TFT having a channel layer made of amorphous silicon), an LTPS-TFT (TFT having a channel layer made of low-temperature polysilicon), and an IGZO-TFT. A thick dotted line indicated by a reference numeral 91 indicates characteristics of the a-SiTFT, a solid line indicated by a reference numeral 92 indicates characteristics of the LTPS-TFT, and a thick solid line indicated by a reference numeral 93 indicates characteristics of the IGZO-TFT. From a portion of dotted line indicated by a reference numeral 99 in FIG. 20, it can be seen that an off leakage current is notably low in the IGZO-TFT as compared to the a-SiTFT and the LTPS-TFT.

As can be seen from FIG. 20, regarding the a-SiTFT and the LTPS-TFT, off characteristics are not good (an off leakage current is relatively high). Accordingly, in a case in which a liquid crystal panel using an a-SiTFT or an LTPS-TFT is employed, electric charges within the panel are discharged relatively quickly when the power supply is stopped. In contrast, regarding the IGZO-TFT, the off characteristics are excellent. Accordingly, in a case in which IGZO-TFT liquid crystal panel employed, electric charges are not sufficiently discharged within a period, for example, until the scanning lines become an unselected stage when the power supply is stopped. As a result, electric charges remain within the panel. In this regard, if electric charges remain within pixel formation portions, since an optimal counter voltage of liquid crystal fluctuates, flicker occurs as described above when the power is turned on. Further, if an electric charge remains on a scanning line, a threshold shift of a TFT whose gate terminal is connected to this scanning line occurs, which reduces an operation margin.

In view of the above, a technique with which an electric charge does not remain within a panel even when an IGZO-TFT liquid crystal panel is employed is disclosed in WO 2014/061574 A. According; to the liquid crystal display device disclosed in WO 2014/061574 A, in order to remove residual charges within the panel quickly and stably when the power supply is stopped, a configuration in which voltages of two systems are used as voltages at a level at which scanning lines are turned to the selected state (each of these voltages is hereinafter referred to as "scanning line selecting voltage") is employed (this configuration is hereinafter referred to as "dual power supply system configuration" for convenience).

However, according to the dual power supply system configuration, since a circuit unit as shown in FIG. 21, for example, is required, a larger number of circuit elements is required as compared to a single power supply system configuration (a configuration in which a voltage of only one system is used as the scanning line selecting voltage). In the example shown in FIG. 21, two diodes, a capacitor, and a resistor are additionally required as compared to the single power supply system configuration. Therefore, the cost of a liquid crystal display device employing the dual power supply system configuration is high. In addition, when a small-sized device such as a mobile telephone or a head-mounted display is realized, there is a possibility that a space for mounting additional circuit elements for the dual power supply system configuration cannot be secured since a size of a printed circuit board (PCB) is limited.

SUMMARY OF THE INVENTION

Thus, the following disclosure aims to realize a low-cost display device capable of suppressing occurrence of display defects due to residual charges and suitable when a TFT having excellent off characteristics is employed.

A display device according to one embodiment includes:

a display panel including a plurality of scanning lines and a scanning line drive circuit, the plurality of scanning lines being connected respectively to a plurality of pixel formation portions, the scanning line drive circuit selectively driving the plurality of scanning lines;

a voltage generation circuit configured to receive external power supply and generate one kind of scanning line selecting voltage and one kind of scanning line unselecting voltage, the scanning line selecting voltage being a voltage for turning the scanning lines to a selected state, the scanning line unselecting voltage being a voltage for turning the scanning lines, to an unselected state; and a drive control circuit configured to control an operation of the scanning line drive circuit using the scanning line selecting voltage and the scanning line unselecting voltage which are generated by the voltage generation circuit, wherein the scanning line drive circuit includes a shift register including a plurality of unit circuits provided so as to respectively correspond to the plurality of scanning lines, the shift register being configured to perform a shift operation based on a plurality of clock signals, each of the plurality of unit circuits includes:
an output node connected to a corresponding scanning; line;
an output control transistor having a control terminal, a first conducting terminal to which one of the plurality of clock signals is supplied, and a second conducting terminal connected to the output node;
an output control node connected to the control terminal of the output control transistor; and
an off control transistor having a control terminal, a first conducting terminal, and a second conducting terminal connected to the output control node, in normal times, the drive control circuit sets a voltage of the plurality of clock signals to the scanning line selecting voltage and the scanning line unselecting voltage alternatingly, and sets a voltage supplied to the control terminal of the off control transistor and a voltage supplied to the first conducting terminal of the off control transistor to the scanning line unselecting voltage, and when the power supply is stopped, the drive control circuit sets the voltage of the plurality of clock signals, the voltage supplied to the control terminal of the off control transistor, and the voltage supplied to the first conducting terminal of the off control transistor to the scanning line selecting voltage.

According to such a configuration, each of the unit circuits that constitute the shift register within the scanning line drive circuit is provided with the off control transistor having the second conducting terminal connected to the output control node, in addition to the conventional components. In such a configuration, when the external power supply is stopped, the voltage supplied to the control terminal of the off control transistor and the voltage supplied to the first conducting terminal of the off control transistor are set to the scanning line selecting voltage. Accordingly, after the power supply is stopped, an electric charge is supplied to the output control node via the off control transistor, and therefore the output control transistor is maintained at the on state for a period longer than that in the conventional technique. With this, in each of the unit circuits, the voltage of scanning line reliably decreases as the voltage of the clock signal decreases. As a result, after the power supply is stopped, the voltage of the scanning line reaches the ground potential within a desired period of time. Therefore, when the power supply is stopped, a residual charge within the pixel formation portion and a residual charge on the scanning line do not occur. Here, since the voltage generation circuit generates one kind of scanning line selecting voltage as a voltage for turning the scanning lines to the selected state, the cost is reduced as compared to the configuration in which two kind of scanning line selecting voltages are generated. From the above, it is possible to realize a low-cost display device capable of suppressing occurrence of display defects due to residual charges and suitable when a TFT having excellent off characteristics is employed.

These and other objects, features, aspects, and effects of the present invention may become more apparent from the following detailed description of the present invention with reference to the appended drawings.

DETAILED DESCRIPTION OF PREFERRED EMBODIMENTS

Hereinafter, a preferred embodiment of the present invention will be described with reference to the drawings. It should be noted that each of the transistors is a field-effect transistor, and more specifically, an n-channel type TFT. In the following description about the n-channel type TFT, a gate terminal corresponds to a control terminal, a drain terminal corresponds to a first conducting terminal, and a source terminal corresponds to a second conducting terminal. In this regard, while one of drain and source with a higher potential is called drain in an n-channel type transistor, in the description herein, one is defined as drain, and the other is defined as source, and therefore a source potential can be higher than a drain potential.

<1. Overall Configuration>

Figure 2:
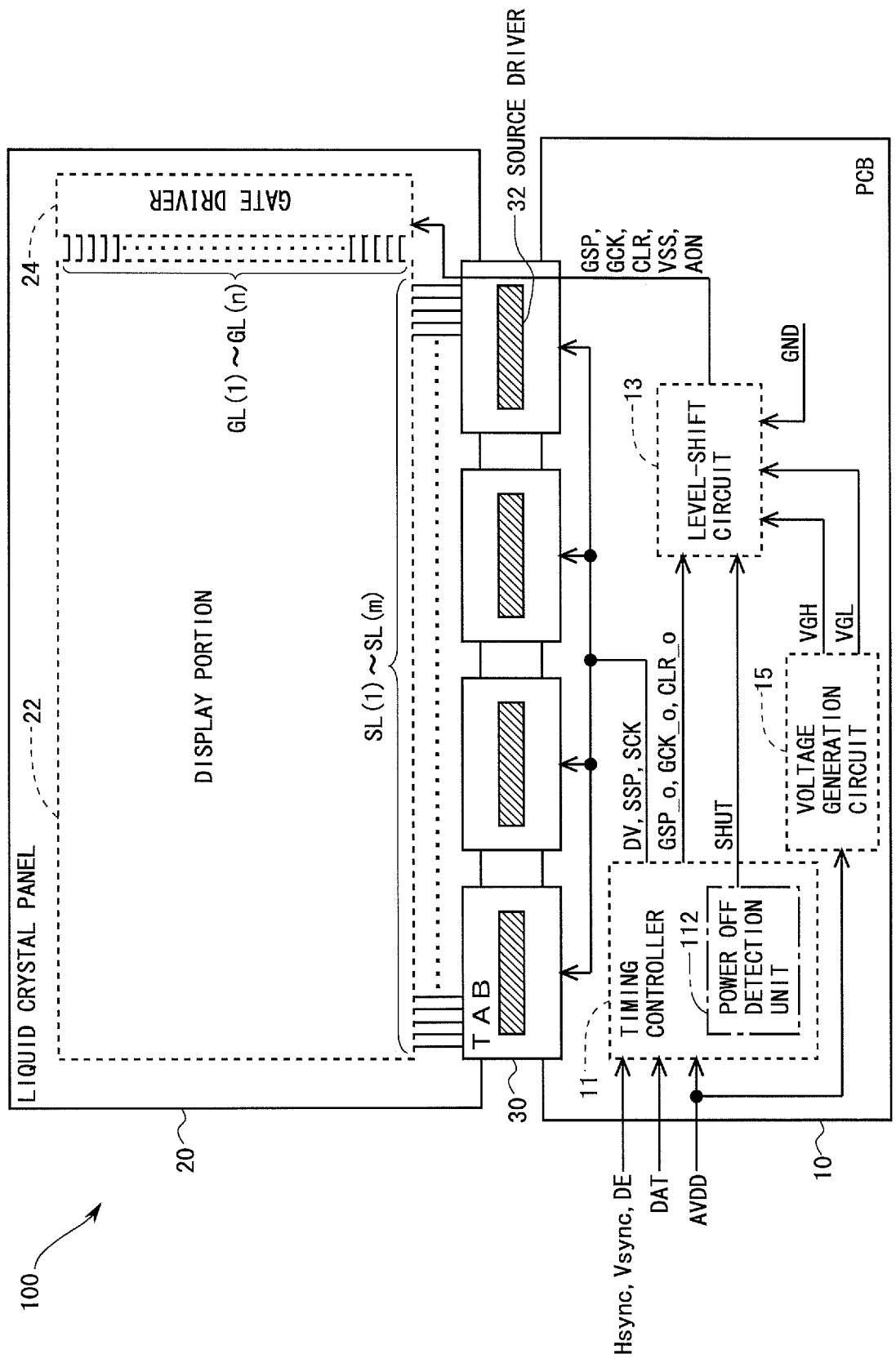
FIG. 2 is a block diagram illustrating an overall configuration of an active matrix-type liquid crystal display device according to the embodiment.

FIG. 2 is a block diagram illustrating an overall configuration of an active matrix-type liquid crystal display device 100 according to one embodiment of the present invention. The liquid crystal display device 100 includes a printed circuit board (PCB) 10, a liquid crystal panel 20 as a display panel, and tape automated bondings (TABs) 30 connected to the PCB 10 and the liquid crystal panel 20. The PCB 10 is provided with a timing controller 11, a level-shift circuit 13, and a voltage generation circuit 15. The liquid crystal panel 20 is an IGZO-TFT liquid crystal panel. The TABs 30 are provided with source drivers 32 for driving data lines SL(1)-SL(m) in the form of an IC chip.

The liquid crystal display device 100 operates by receiving external power supply (analog power supply). Hereinafter, a voltage inputted to the liquid crystal display device 100 based on this power supply is referred to as an "input power voltage". The input power voltage is indicated by a reference numeral AVDD. An example of the input power voltage AVDD in normal operation is +5V. When the power supply is stopped, the input power voltage AVDD decreases gradually from +5V to 0V (ground potential GND), for example.

The liquid crystal panel 20 includes a liquid crystal layer, and two substrates (typically, glass substrates) that hold the liquid crystal layer. On a predetermined area of the substrates, a display portion 22 for displaying an image is provided. The display portion 22 includes n scanning lines GL(1)-GL(n), m data lines SL(1)-SL(m), and m×n pixel formation portions arranged in a matrix so as to correspond to respective intersections between the n scanning lines GL(1)-GL(n) and the m data lines SL(1)-SL(m). Here, m and n are integers both of which are 2 or greater.

Figure 3:
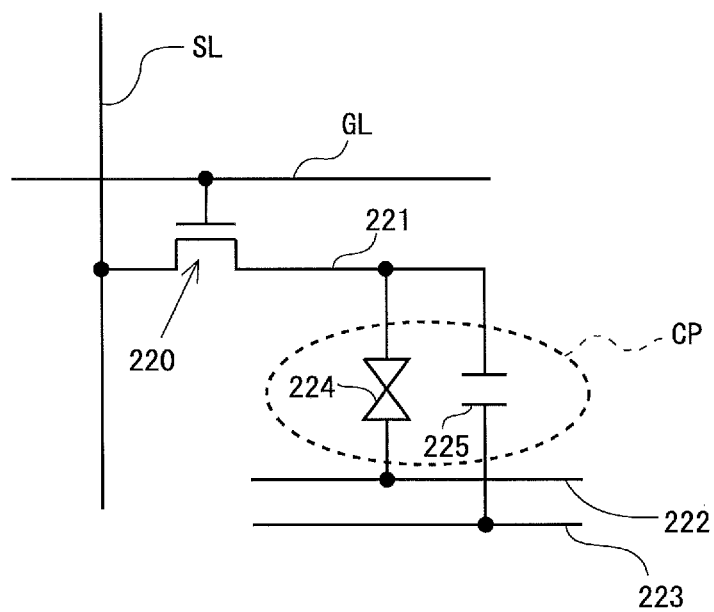
FIG. 3 is a circuit diagram illustrating a configuration of a pixel formation portion according to the embodiment.

FIG. 3 is a circuit diagram illustrating a configuration of one pixel formation portion. Each of the pixel formation portions includes: a thin film transistor 220 having a gate terminal connected to a scanning line GL that passes through a corresponding intersection and a source terminal connected to a data line SL that passes through the same intersection; a pixel electrode 221 connected to a drain terminal of the thin film transistor 220; a common electrode 222 and an auxiliary capacitance electrode 223 that are provided commonly to the m×n pixel formation portions; a liquid crystal capacitance 224 formed by the pixel electrode 221 and the common electrode 222; and an auxiliary capacitance 225 formed by the pixel electrode 221 and the auxiliary capacitance electrode 223. A pixel capacitance CP is formed by the liquid crystal capacitance 224 and the auxiliary capacitance 225. When the scanning line connected to the gate terminal of the thin film transistor 220 is turned to the selected state, the thin film transistor 220 is turned to an on state and a data signal transmitted by the data line SL is written to the pixel capacitance CP. Here, in this embodiment, the thin film transistor 220 is an n-channel type IGZO-TFT.

The liquid crystal panel 20 is further provided with a gate driver (scanning line drive circuit) 24 for driving the scanning lines GL(1)-GL(n) as shown in FIG. 2. The gate driver 24 is an IGZO-GDM, and formed monolithically on one of the substrates that constitute the liquid crystal panel 20. Although the gate driver 24 is provided for only one side of the display portion 22 in FIG. 2, the gate driver 24 may be provided on each side of the display portion 22.

As described above, in this embodiment, the m data lines SL(1)-SL(m), the n scanning lines GL(1)-GL(n), the m×n pixel formation portions, and the gate driver 24 are formed on one of the substrates that constitute the liquid crystal panel 20.

To the liquid crystal display device 100, timing signals such as a horizontal synchronization signal Hsync, a vertical synchronization signal Vsync, and a data enable signal DE, an image signal DAT, and the input power voltage AVDD are externally supplied. The input power voltage AVDD is supplied to the timing controller 11 and the voltage generation circuit 15.

The voltage generation circuit 15 generates, based on the input power voltage AVDD, a gate on voltage VGH which is a voltage for turning the scanning lines GL to the selected state in normal operation, and a gate off voltage VGL which is a voltage for turning the scanning lines GL to an unselected state in normal operation. Although levels of the gate on voltage VGH and the gate off voltage VGL generated by the voltage generation circuit 15 are kept constant in normal operation, these levels change when the power supply is stopped. It should be noted that, in normal operation, for example, the gate on voltage VGH is set to +20V, and the gate off voltage VGL is set to −10V. The gate on voltage VGH and the gate off voltage VGL generated by the voltage generation circuit 15 are supplied to the level-shift circuit 13. As described above, a single power supply system configuration is employed for a voltage for turning the scanning lines GL to the selected state.

The timing controller 11 receives timing signals such as, the horizontal synchronization signal Hsync, the vertical synchronization signal Vsync, and the data enable signal DE, the image signal DAT, and the input power voltage AVDD, and generates a digital video signal DV, a source start pulse signal SSP, a source clock signal SCK, a gate start pulse signal GSP_o, a gate clock signal GCK_o, and a clear signal CLR_o. The digital video signal DV, the source start pulse signal SSP, and the source clock signal SCK are supplied to the source driver 32, and the gate start pulse signal GSP_o, the gate clock signal GCK_o, and the clear signal CLR_o are supplied to the level-shift circuit 13. It should be noted that, as for the gate start pulse signal GSP_o, the gate clock signal GCK_o, and the clear signal CLR_o, high-level side voltages are set to the input power voltage AVDD, and low-level side voltages are set to the ground potential GND.

The timing controller 11 includes a power off detection unit 112. The power off detection unit 112 generates a power state signal SHUT indicating a state of the external power supply (a state of power on/off), and supplies the generated signal to the level-shift circuit 13.

The level-shift circuit 13 converts voltage levels of the gate start pulse signal GSP_o, the gate clock signal GCK_o, and the clear signal CLR_o outputted from the timing controller 11, using the gate on voltage VGH and the gate off voltage VGL supplied from the voltage generation circuit 15. A gate start pulse signal GSP, a gate clock signal GCK, and a clear signal CLR after the voltage level conversion by the level-shift circuit 13 are supplied to the gate driver 24. Further, based on internal signals, the level-shift circuit 13 generates a reference voltage VSS which is a voltage as a reference of an operation of the gate driver 24. The reference voltage VSS is supplied to the gate driver 24. Further, the level-shift circuit 13 generates an off control signal AON based on the power state signal SHUT. The off control signal AON is supplied to the gate driver 24. It should be noted that the off control signal AON is transmitted from the level-shift circuit 13 to the gate driver 24 via a dedicated line.

In the meantime, when the power state signal SHUT indicates that the power is normally supplied (that is, in normal operation), the level-shift circuit 13 sets a voltage of the gate start pulse signal GSP, a voltage of the gate clock signal GCK, and a voltage of the clear signal CLR to the gate on voltage VGH or the gate off voltage VGL respectively depending on the gate start pulse signal GSP_o, the gate clock signal GCK_o, and the clear signal CLR_o, and sets the reference voltage VSS and a voltage of the off control signal AON to the gate off voltage VGL. In contrast, when the power state signal SHUT Indicates that the power supply is stopped (that is, when the power is off), the level-shift circuit 13 sets the voltage of the gate clock signal GCK, the reference voltage VSS, and the voltage of the off control signal AON to the gate on voltage VGH, and sets the voltage of the gate start pulse signal GSP and the voltage of the clear signal CLR to the ground potential GND.

The source driver 32 receives the digital video signal DV, the source start pulse signal SSP, and the source clock signal SCK outputted from the timing controller 11, and applies data signals to the data lines SL(1)-SL(m).

The gate driver 24 receives the gate start pulse signal GSP, the gate clock signal GCK, the clear signal CLR, the reference voltage VSS, and the off control signal AON outputted from the level-shift circuit 13, and repeats application of active scanning signals to the scanning lines GL(1)-GL(n) with a vertical scanning period as a cycle. It should be noted that further details of the gate driver 24 will be described later.

In this manner, by applying the data signals to the data line SL(1)-SL(m) and the scanning signals to the scanning lines GL(1)-GL(n), an image based on the image signal DAT that is externally supplied is displayed in the display portion 22.

It should be noted that, in this embodiment, the timing controller 11 and the level-shift circuit 13 realizes a drive control circuit.

Figure 4:
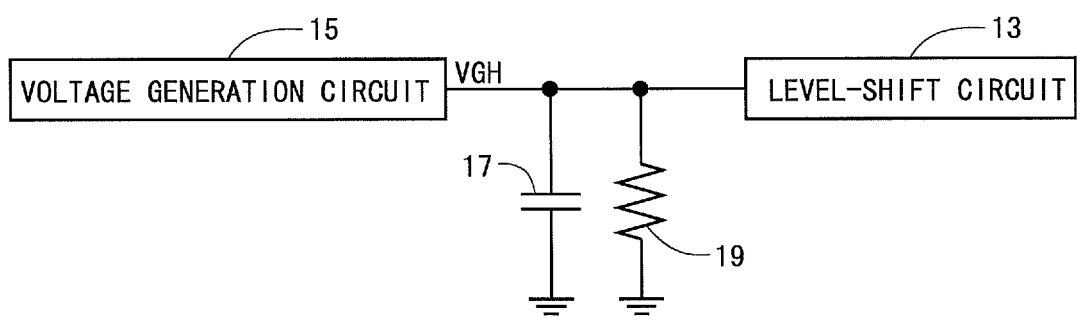
FIG. 4 is a diagram for illustration of a line for supplying a gate on voltage from a voltage generation circuit to a level-shift circuit according to the embodiment.

In the meantime, in this embodiment, a capacitor 17 and a resistor 19 are connected to a line for supplying the gate on voltage VGH from the voltage generation circuit 15 to the level-shift circuit 13 so that a voltage level of the input power voltage AVDD gradually decreases in a sloped manner when the power supply is stopped, as shown in FIG. 4.

<2. Configuration of Gate Driver>
<2.1 Outline>

Figure 5:
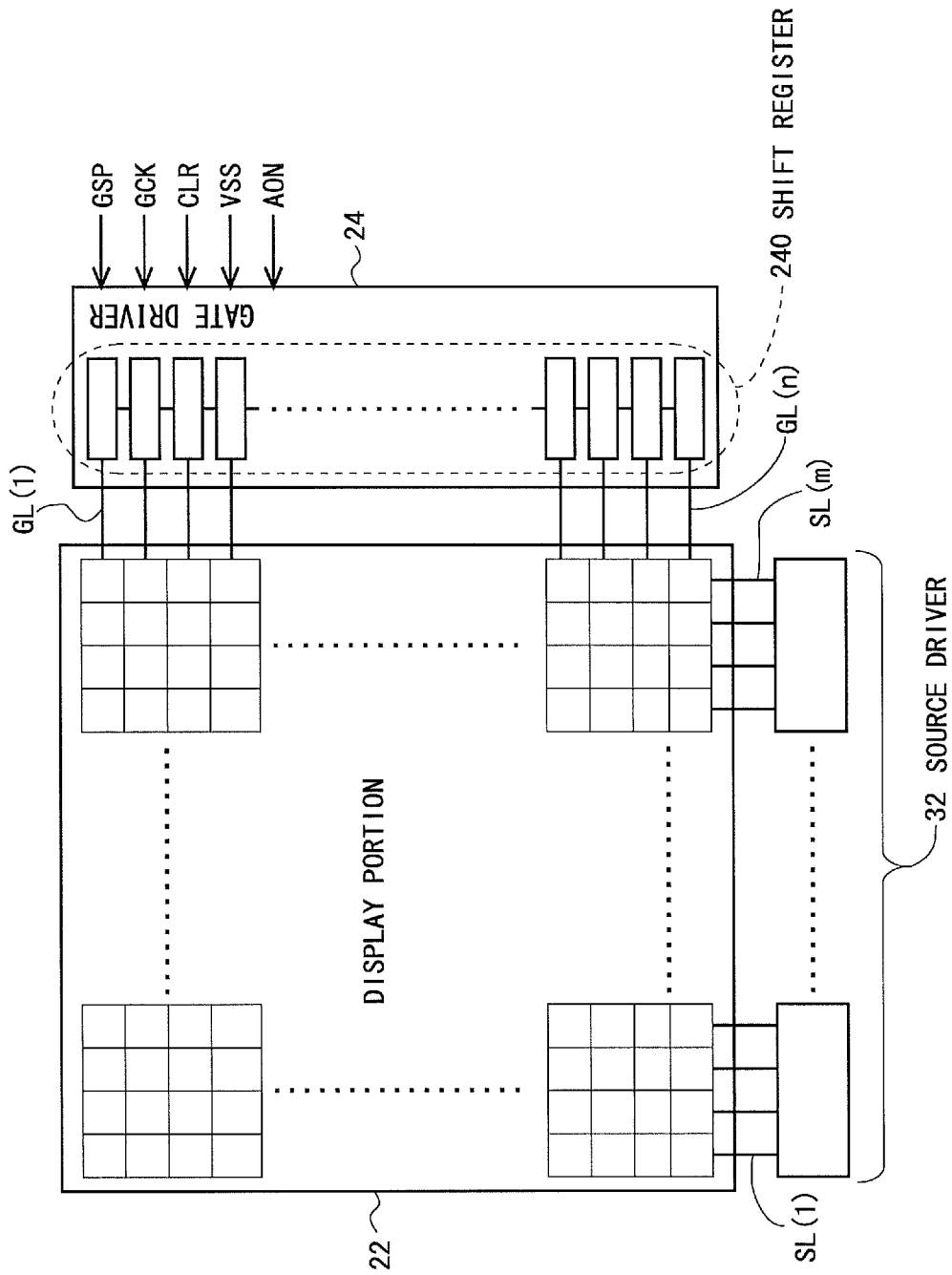
FIG. 5 is a block diagram for illustration of a configuration of a gate driver according to the embodiment.

FIG. 5 is a block diagram for illustration of a configuration of the gate driver 24. The gate driver 24 includes a shift register 240 including a plurality of stages. The display portion 22 is provided with a pixel matrix of n rows×m columns, and each of the stages of the shift register 240 is provided so as to correspond to each of rows of the pixel matrix one by one. Hereinafter, a circuit that constitutes each of the stages of the shift register 240 is referred to as a "unit circuit".

<2.2 Shift Register>

Figure 6:
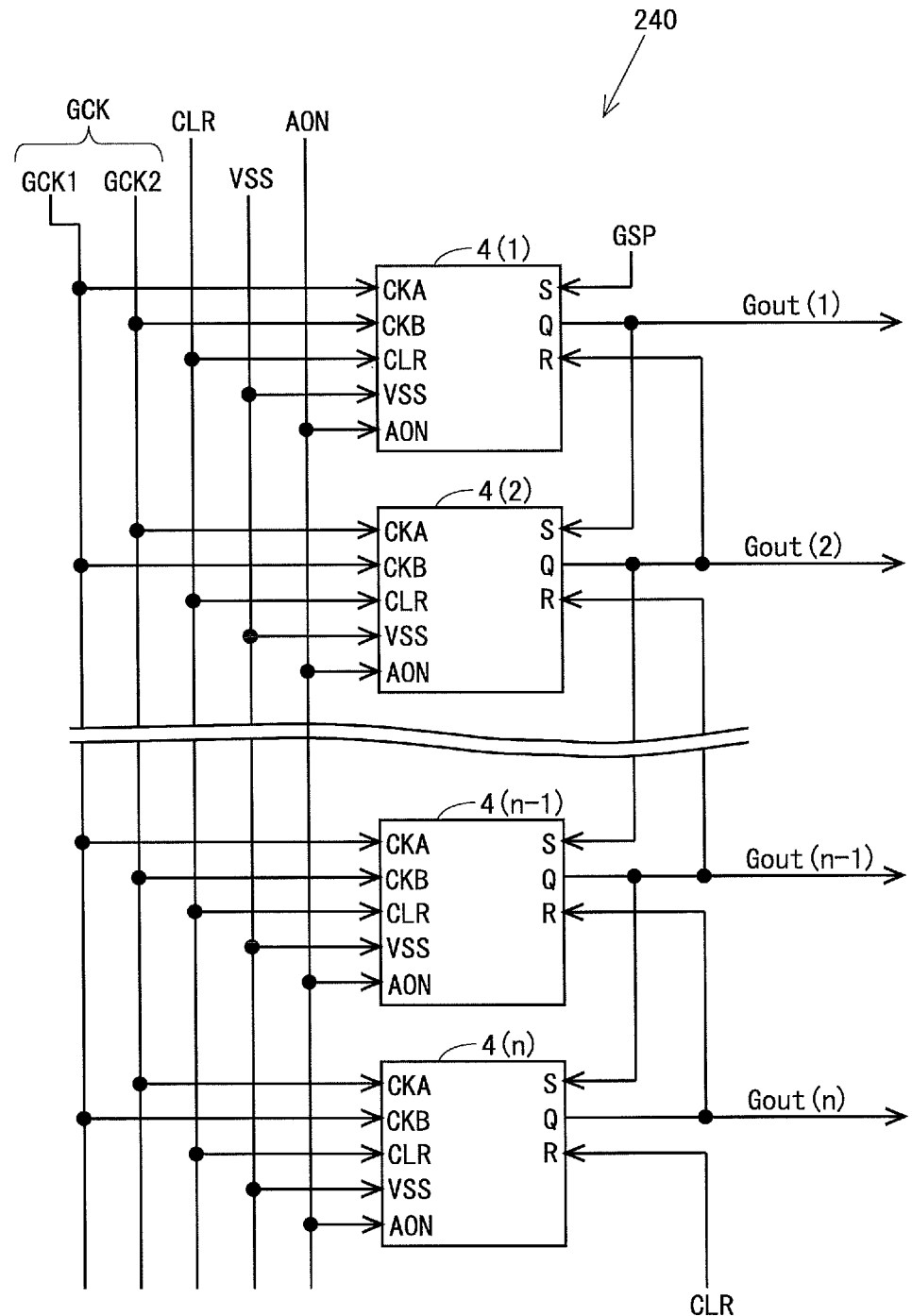
FIG. 6 is a block diagram illustrating a configuration of a shift register according to the embodiment.

FIG. 6 is a block diagram illustrating a configuration of the shift register 240. It should be noted that FIG. 6 shows configurations of unit circuits 4(1), 4(2), 4(n−1), and 4(n) of a first stage, a second stage, an (n−1)th stage, and an n-th stage of the shift register 240. To the shift register 240, the gate start pulse signal GSP, the gate clock signal GCK, the clear signal CLR, the reference voltage VSS, and the off control signal AON are supplied. In this embodiment, the gate clock signal GCK is configured by two-phase clock signals (a first gate clock signal GCK1 and a second gate clock signal GCK2).

Each of the unit circuits 4 includes input terminals for respectively receiving a first clock CKA, a second clock CKB, the clear signal CLR, the reference voltage VSS, the off control signal AON, a set signal S, and a reset signal R, and an output terminal for outputting an output signal Q. To the unit circuits 4 of odd-numbered stages, the first gate clock signal GCK1 is supplied as the first clock CKA, and the second gate clock signal GCK2 is supplied as the second clock CKB. To the unit circuits 4 of even-numbered stages, the second gate clock signal GCK2 is supplied as the first clock CKA, and the first gate clock signal GCK1 is supplied as the second clock CKB. Further, to each of the unit circuits 4, the output signal Q from the unit circuit 4 of a previous stage is supplied as the set signal S, and the output signal Q from the unit circuit 4 of a subsequent stage is supplied as the reset signal R. However, the gate start pulse signal GSP is supplied as the set signal S to the unit circuit 4(1) of the first stage, and the clear signal CLR is supplied as the reset signal R to the unit circuit 4(n) of the n-th stage. Further, the output signal Q from each unit circuit 4 is supplied to the corresponding scanning line GL as a scanning signal Gout.

Figure 7:
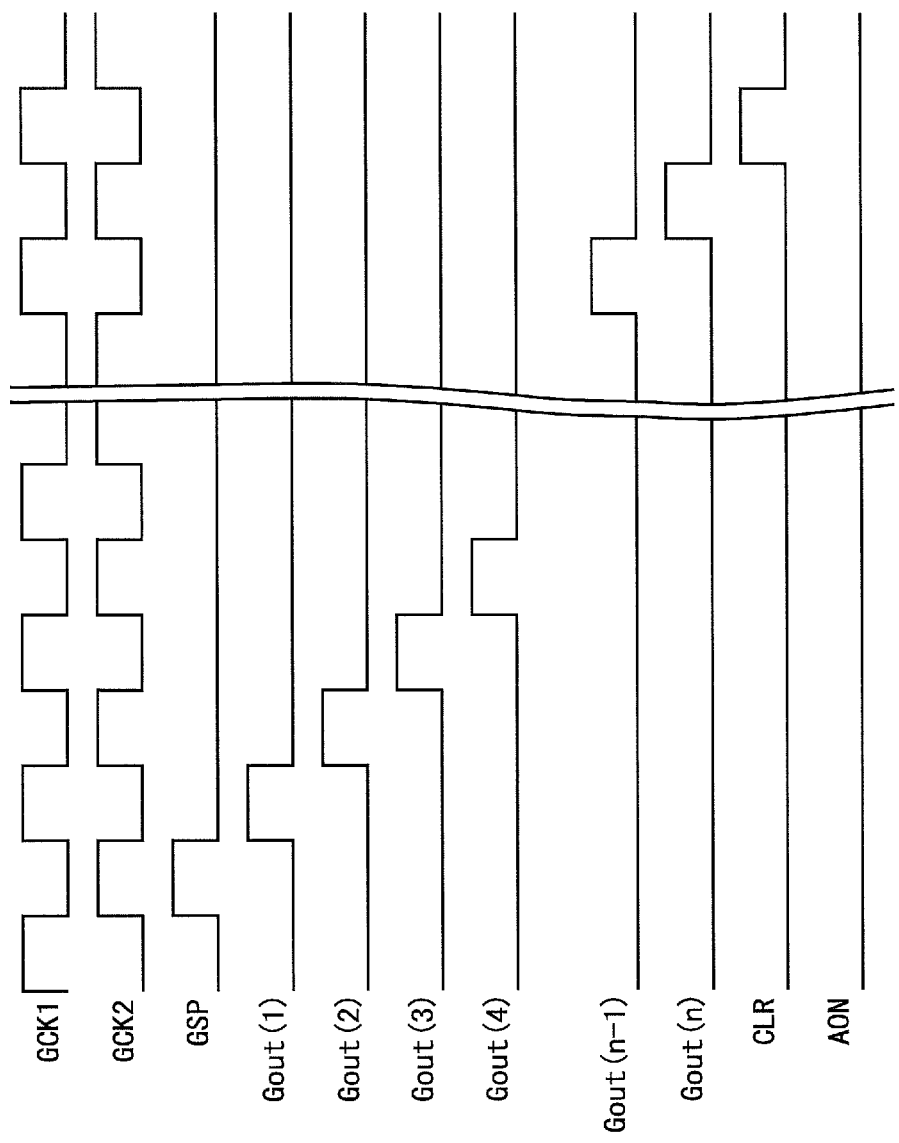
FIG. 7 is a timing chart for illustration of an operation of the shift register according to the embodiment.

In the configuration as described above, when a pulse of the gate start pulse signal GSP is supplied as the set signal 5 to the unit circuit 4(1) of the first stage of the shift register 240, a pulse (which is contained in the output signal Q outputted from each unit circuit 4) contained in the gate start pulse signal GSP is sequentially transferred, based on the first gate clock signal GCK1 and the second gate clock signal GCK2 whose on-duty is adjusted to about 50%, from the unit circuit 4(1) of the first stage to the unit circuit 4(n) of the n-th stage. Then, depending on the transfer of the pulse, the output signals Q outputted from the unit circuits 4(1)-4(n) of the first to the n-th stages are sequentially turned to a high level. With this, as shown in FIG. 7, the scanning signals Gout(1)-Gout (n) that are sequentially turned to a high level for a predetermined period are supplied to the scanning lines GL(1)-GL(n) within the display portion 22.

<2.3 Unit Circuit>

Figure 1:
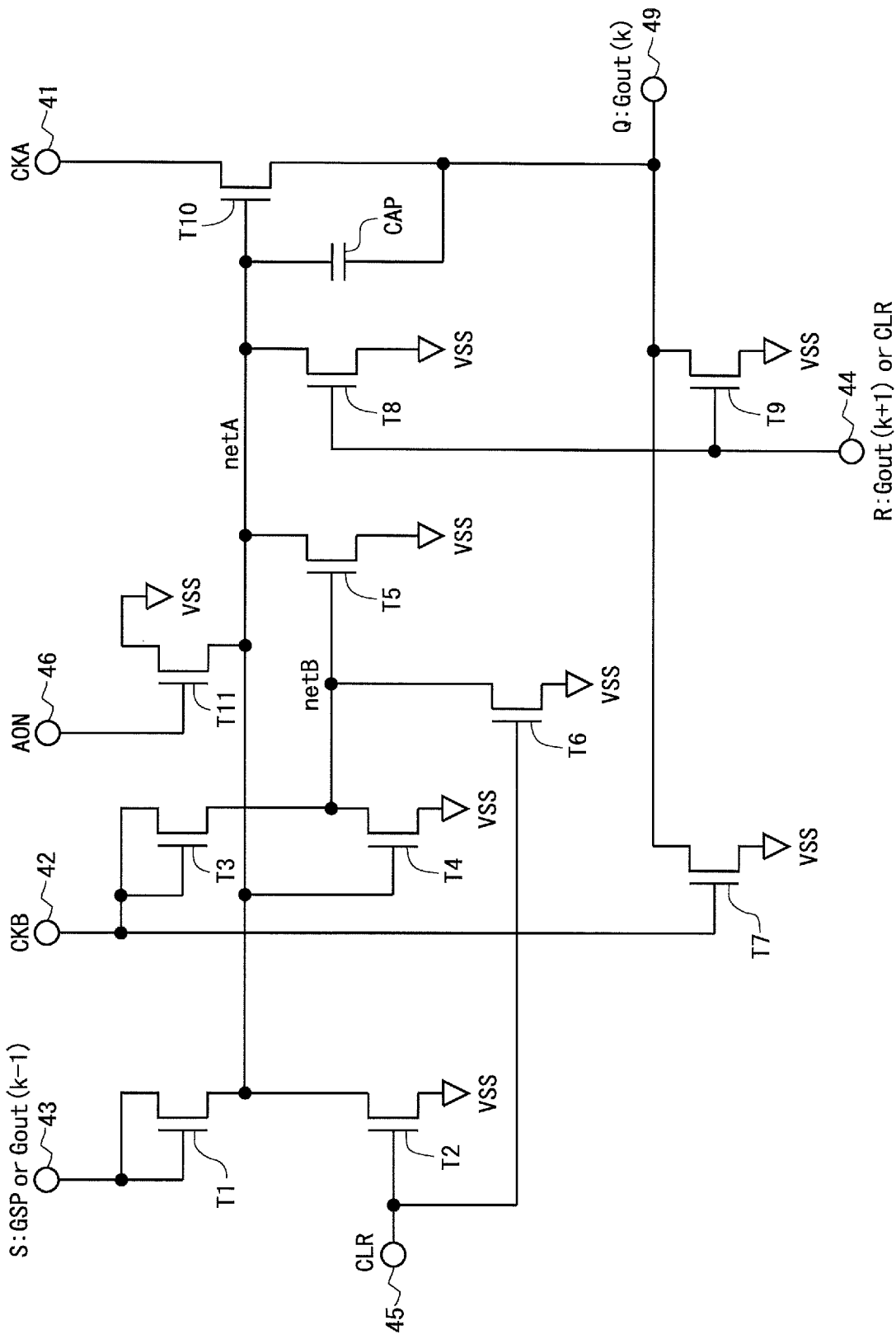
FIG. 1 is a circuit diagram illustrating a configuration of a unit circuit according to one embodiment.

FIG. 1 is a circuit diagram illustrating a configuration of the unit circuit 4 (assumed to be of the k-th stage) according to this embodiment. As shown in FIG. 1, the unit circuit 4 includes 11 thin film transistors T1-T11 and a capacitor CAP. Further, the unit circuit 4 includes six input terminals 41-46 and an output terminal (output node) 49 in addition to an input terminal connected to a reference voltage line (a line for transferring the reference voltage VSS). In FIG. 1, an input terminal for receiving the first clock CKA is indicated by a reference numeral 41, an input terminal for receiving the second clock CKB is indicated by a reference numeral 42, an input terminal for receiving the set signal S is indicated by a reference numeral 43, an input terminal for receiving the reset signal R is indicated by a reference numeral 44, an input terminal for receiving the clear signal CLR is indicated by a reference numeral 45, an input terminal for receiving the off control signal AON is indicated by a reference numeral 46, and an output terminal for outputting the output signal Q is indicated by a reference numeral 49.

A source terminal of the thin film transistor T1, a drain terminal of the thin film transistor T2, a gate terminal of the thin film transistor T4, a drain terminal of the thin film transistor T5, a drain terminal of the thin film transistor T8, a gate terminal of the thin film transistor T10, a source terminal of the thin film transistor T11, and one end of the capacitor CAP are connected to each other. It should be noted that a region (wiring) where these terminals are connected to each other is referred to as an "output control node". The output control node is indicated by a reference numeral netA. A source terminal of the thin film transistor T3, a drain terminal of the thin film transistor T4, a gate terminal of the thin film transistor T5, and a drain terminal of the thin film transistor T6 are connected to each other. It should be noted that a region (wiring) where these terminals are connected to each other is referred to as a "stabilization node". The stabilization node is indicated by a reference numeral netB.

Regarding the thin film transistor T1, a gate terminal and a drain terminal are connected to the input terminal 43 (that is, diode-connected), and the source terminal is connected to the output control node netA. Regarding the thin film transistor T2, a gate terminal is connected to the input terminal 45, the drain terminal is connected to the output control node netA, and a source terminal is connected to the reference voltage line. Regarding the thin film transistor T3, a gate terminal and a drain terminal are connected to the input terminal 42 (that is, diode-connected), and the source terminal is connected to the stabilization node netB. Regarding the thin film transistor T4, the gate terminal is connected to the output control node netA, the drain terminal is connected to the stabilization node netB, and a source terminal is connected to the reference voltage line. Regarding the thin film transistor T5, the gate terminal is connected to the stabilization node netB, the drain terminal is connected to the output control node netA, and a source terminal is connected to the reference voltage line. Regarding the thin film transistor T6, a gate terminal is connected to the input terminal 45, the drain terminal is connected to the stabilization node netB, and a source terminal is connected to the reference voltage line.

Regarding the thin film transistor T7, a gate terminal is connected to the input terminal 42, a drain terminal is connected to the output terminal 49, and a source terminal is connected to the reference voltage line. Regarding the thin film transistor T8, a gate terminal is connected to the input terminal 44, the drain terminal is connected to the output control node netA, and a source terminal is connected to the reference voltage line. Regarding the thin film transistor T9, a gate terminal is connected to the input terminal 44, a drain terminal is connected to the output terminal 49, and a source terminal is connected to the reference voltage line. Regarding the thin film transistor T10, the gate terminal is connected to the output control node netA, a drain terminal is connected to the input terminal 41, and a source terminal is connected to the output terminal 49. Regarding the thin film transistor T11, a gate terminal is connected to the input terminal 46, a drain terminal is connected to the reference voltage line, and the source terminal is connected to the output control node netA. Regarding the capacitor CAP, one end is connected to the output control node netA, and the other end is connected to the output terminal 49.

It should be noted that, in this embodiment, the thin film transistor T10 realizes an output control transistor, and the thin film transistor T11 realizes an off control transistor.

<3. Operation in Normal Times>

Figure 8:
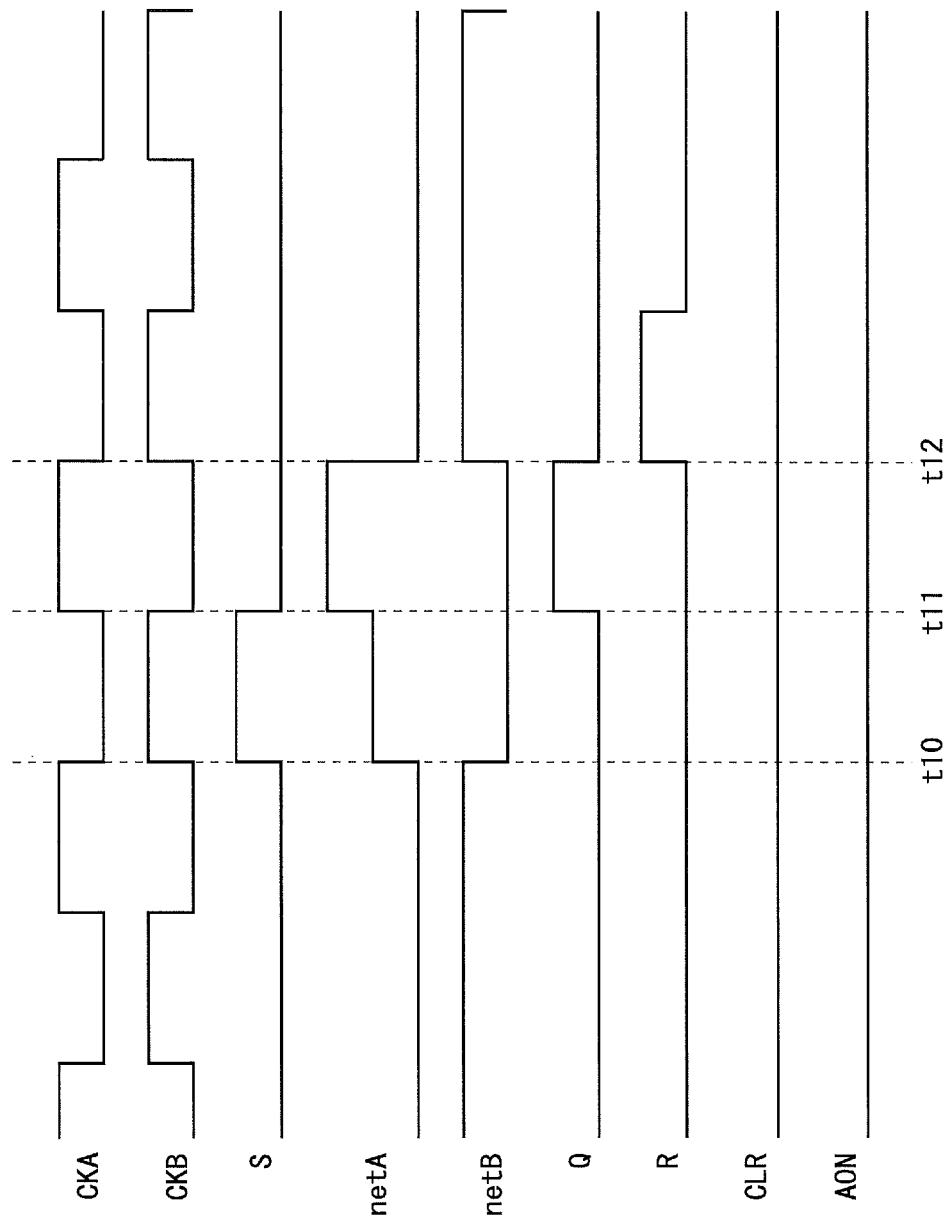
FIG. 8 is a timing chart for illustration of an operation of the unit circuit in normal times according to the embodiment.

Referring to FIG. 8, an operation of the unit circuit 4 in normal times will be described. During a period in which the liquid crystal display devise 100 operates, the first clock CKA and the second clock CKB whose on-duty is adjusted to about 50% are supplied to the unit circuit 4. Regarding the first clock CKA and the second clock CKB, a high-level side voltage is set to the gate on voltage VGH, and a low-level side voltage is set to the gate off voltage VGL. It should be noted that, as shown in FIG. 8, the off control signal AON is maintained at low level in normal times. With this, the thin film transistor T11 is maintained to be an off state in normal times.

In a period before a time point t10, a voltage of the output control node netA is maintained at low level, a voltage of the stabilization node nets is maintained at high level, and the output signal Q is maintained at low level.

At the time point t10, the set signal S changes from low level to high level. Since the thin film transistor T1 is diode-connected as shown in FIG. 1, the thin film transistor T1 is turned to the on state by a pulse of the set signal S, and the capacitor CAP is charged. With this, the voltage of the output control node netA changes from low level to high level, and the thin film transistor T10 becomes the on state. However, as the first clock CKA is at low level at the time point t10, the output signal Q is maintained at low level. Further, by the voltage of the output control node netA changing from low level to high level, the thin film transistor T4 becomes the on state. With this, the voltage of the stabilization node netB becomes low level.

At a time point tall, the first clock CKA changes from low level to high level. At this time, since the thin film transistor T10 is at the on state, a voltage at the output terminal 49 increases as a voltage at the input terminal 41 increases. Here, since the capacitor CAP is provided between the output control node netA and the output terminal 49 as shown in FIG. 1, the voltage of the output control node netA also increases as the voltage at the output terminal 49 increases (the output control node netA becomes a boosted state). As a result, a large voltage is applied to the gate terminal of the thin film transistor T10, and a voltage of the output signal Q increases up to a level enough for the scanning line GL connected to this output terminal 49 to become the selected state.

At a time point t12, the first clock CKA changes from high level to low level. With this, the voltage at the output terminal 49 (the voltage of the output signal Q) decreases as the voltage at the input terminal 41 decreases. When the voltage at the output terminal 49 decreases, the voltage of the output control node netA also decreases via the capacitor CAP. Further, at the time point t12, the reset signal R changes from low level to high level. With this, the thin film transistor T8 and the thin film transistor T9 become the on state. From the above, the voltage of the output control node netA and the voltage at the output terminal 49 (the voltage of the output signal Q) are turned to low level.

By the operation described above being performed in each of the unit circuits 4 within the shift register 240, the scanning signals Gout(1)-Gout(n) that are turned to high level sequentially for a predetermined period as shown in FIG. 7 are supplied to the scanning lines GL(1)-GL(n) within the display portion 22.

In the meantime, the clear signal CLR changes from low level to high level, after all of the scanning signals Gout (1)-Gout(n) are turned to high level in each vertical scanning period (see FIG. 7). With this, the states of all of the unit circuits 4(1)-4 (n) and all of the scanning lines GL(1)-GL(n) are reset.

<4. Operation when Power Supply is Stopped>
<4.1 Outline>

Next, an operation when the power supply is stopped will be described. When the power supply is stopped, the power off detection unit 112 notifies the level-shift circuit 13 by the power state signal SHUT that the power supply is stopped. With this, the level-shift circuit 13 sets the voltage of the gate clock signal GCK, the reference voltage VSS, and the voltage of the off control signal AON to the gate on voltage VGH, and sets the voltage of the gate start pulse signal GSP and the voltage of the clear signal CLR to the ground potential GND.

By setting the voltage of the gate clock signal GCK, the reference voltage VSS, and the voltage of the off control signal AON to the gate on voltage VGH, the output signal Q from each of the unit circuits 4 is turned to high level. Specifically, all of the scanning lines GL(1)-GL(n) become the selected state. At this time, a black voltage is applied to all of the data lines SL(1)-SL(m). From the above, an electric charge accumulated in the pixel capacitance CP within each of the pixel formation portions is discharged.

Further, while the voltage of the scanning signal Gout decreases as the voltage of the gate clock signal GCK decreases, the thin film transistor T11 becomes the on state by setting the reference voltage VSS and the voltage of the off control signal AON to the gate on voltage VGH, and an electric charge is supplied to the output control node netA via the thin film transistor T11. More specifically, an electric charge is supplied to the output control node netA as long as a voltage between the gate and the source of the thin film transistor T11 is greater than a threshold voltage. Accordingly, when the power supply is stopped, the thin film transistor T10 is maintained at the on state for a period longer than that in the conventional technique with this, in each of the unit circuits 4, the voltage of the output terminal 49 reliably decreases as the voltage of the input terminal 41 decreases. Then, the voltage of the scanning signal Gout reaches the ground potential GND within a desired period of time after the power supply is stopped. In this manner, an electric charge on each of the scanning lines GL is discharged.

<4.2 Simulation Result>

Next, a simulation result relating to the operation when the power is turned off will be described. First, in the following description, an operation in a case in which a unit circuit having a conventional configuration is used will be described as comparative examples (a first comparative example and a second comparative example). Thereafter, the operation according to this embodiment will be described. It should be noted that the unit circuit having a conventional configuration is a unit circuit with a configuration shown in FIG. 9. Unlike the unit circuit 4 according to this embodiment (see FIG. 1), the unit circuit having the configuration shown in FIG. 9 is not provided with the thin film transistor T11.

<4.2.1 First Comparative Example>

Figure 9:
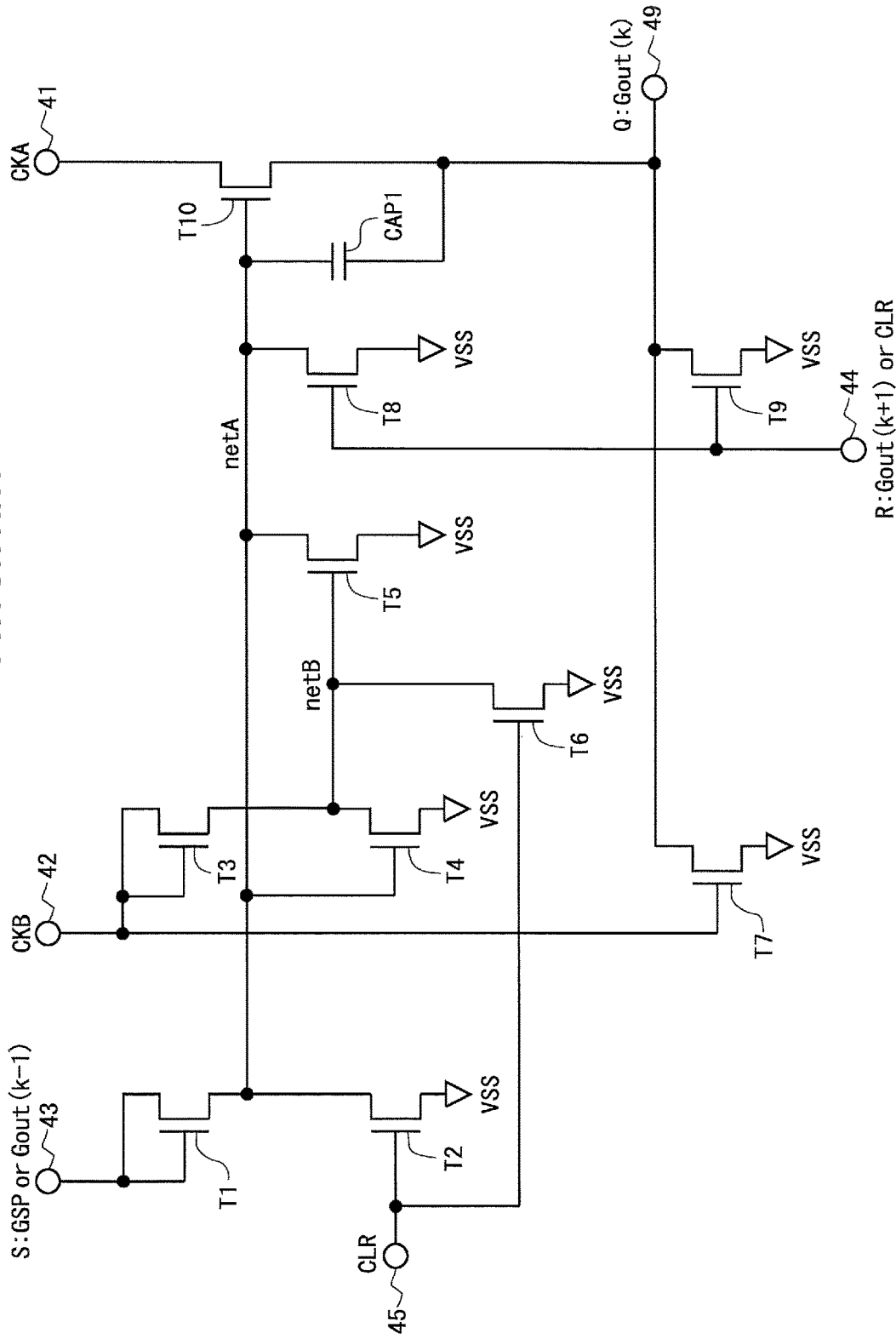
FIG. 9 is a circuit diagram illustrating a configuration of a conventional unit circuit.
Figure 10:
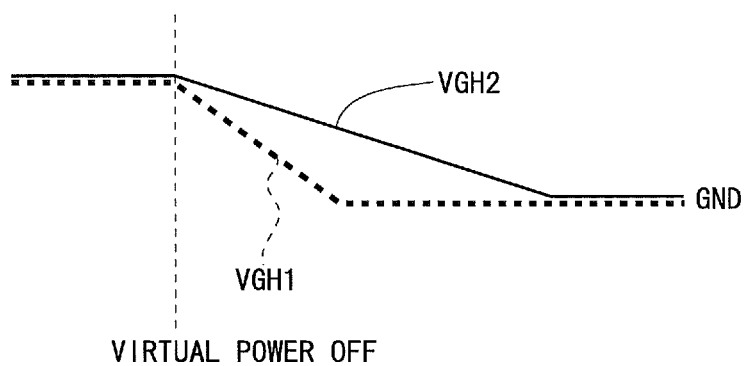
FIG. 10 is a waveform diagram showing two gate on voltages used in a first comparative example regarding simulation.

The first comparative example is an example in which the configuration shown in FIG. 9 is employed as the configuration of the unit circuit, and the dual power supply system configuration is employed for the configuration of the power supply system. In the first comparative example, the simulation was carried by supplying the four input signals (the gate clock signal GCK, the reference voltage VSS, the gate start pulse signal GSP, and the clear signal CLR) based on two gate on voltages (a first gate on voltage VGH1 and a second gate on voltage VGH2) whose voltage waveforms change as shown in FIG. 10 to a gate driver including a shift register constituted by the unit circuits having the configuration shown in FIG. 9. It should be noted that, regarding the four input signals, high-level side voltages of the gate start pulse signal GSP, the gate clock signal GCK, and the reference voltage VSS are set to the first gate on voltage VGH1, and a high-level side voltage of the clear signal CLR is set to the second gate on voltage VGH2. In the meantime, even if the voltages of the input signals before the virtual power off are not set to the gate on voltage, this may not affect the simulation result. Further, the actual waveform of the input signal is an exponential decay waveform having a time constant determined by a capacitor and a resistor, this also may not particularly affect the simulation result.

Figure 11:
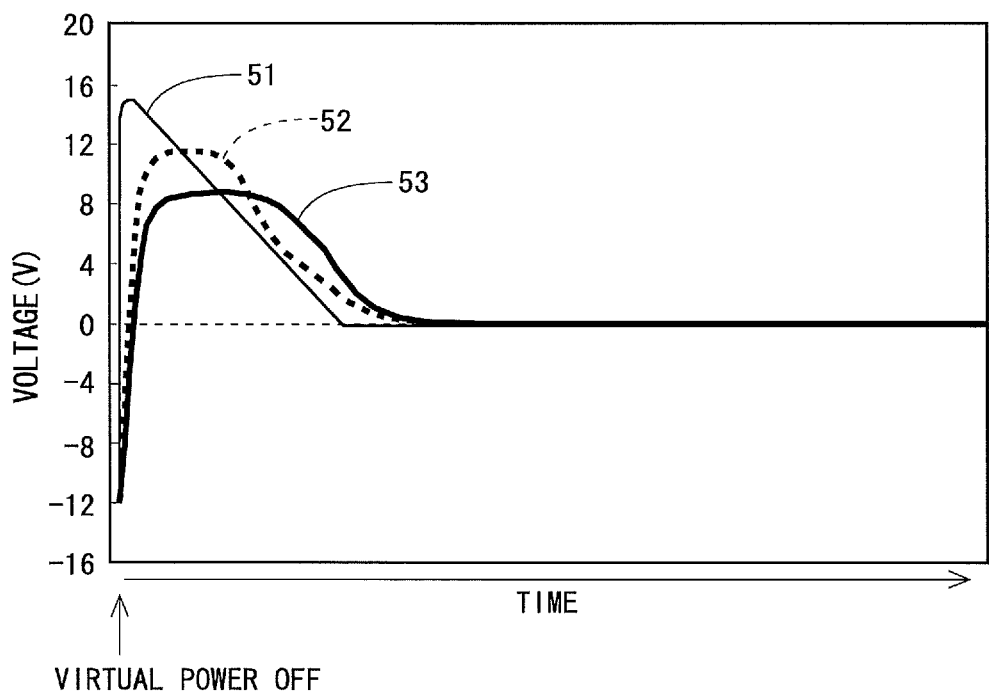
FIG. 11 is a diagram showing a simulation result of the first comparative example.

FIG. 11 is a diagram showing a simulation result of the first comparative example. It should be noted that FIG. 11 shows a voltage waveform change 51 of the gate clock signal GCK, a voltage waveform change 52 of the output control node netA, and a voltage waveform change 53 of the scanning signal Gout. According to the simulation result, the voltage of the scanning signal Gout is increased to high level immediately after the power is turned off in order to remove an electric charge within a pixel formation portion. Thereafter, the voltage of the scanning signal Gout decreases over time. Here, as can be seen from FIG. 11, the voltage of the scanning signal Gout reaches the ground potential GND after a lapse of a predetermined time period from the time of power-off. Further, the voltage of the output control node netA also reaches the ground potential GND after a lapse of a predetermined time period from the time of power-off.

As described above, in a case in which the dual power supply system configuration is employed, even if the configuration of the unit circuit is conventional as shown in FIG. 9, electric charges within the panel are quickly removed when the power supply is stopped. However, as described above, since a larger number of circuit elements are required as compared to the single power supply system configuration, the cost is high.

<4.2.2 Second Comparative Example>

Figure 12:
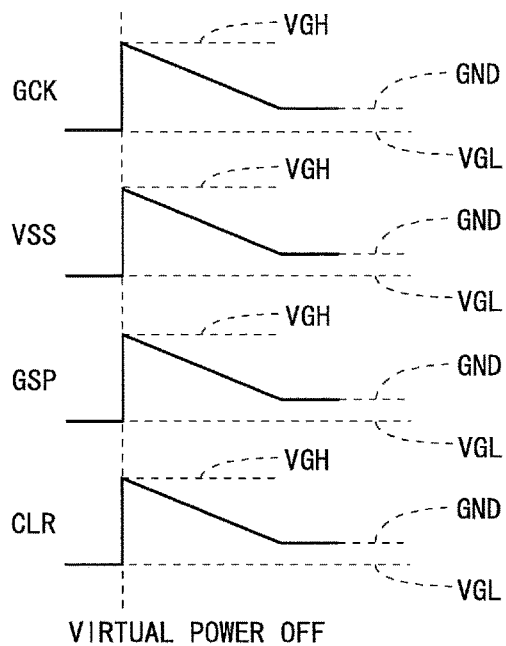
FIG. 12 is a waveform diagram showing four input signals used in a second comparative example regarding the simulation.

The second comparative example is an example in which the configuration shown in FIG. 9 is employed as the configuration of the unit circuit, and the single power supply system configuration is employed for the configuration of the power supply system. In the second comparative example, the simulation was carried by supplying the four input signals (the gate clock signal GCK, the reference voltage VSS, the gate start pulse signal GSP, and the clear signal CLR) whose voltage waveforms change as shown in FIG. 12 to the gate driver including the shift register constituted by the unit circuits having the configuration shown in FIG. 9. It should be noted that, even if the voltages of the input signals before the virtual power off are not set to the gate off voltage VGL, this may not affect the simulation result. Further, although a triangular wave is employed here as the waveform of the input signals in order to simplify the simulation, the actual waveform of the input signal is an exponential decay waveform having a time constant determined by a capacitor and a resistor. However, this also may not particularly affect the simulation result.

Figure 13:
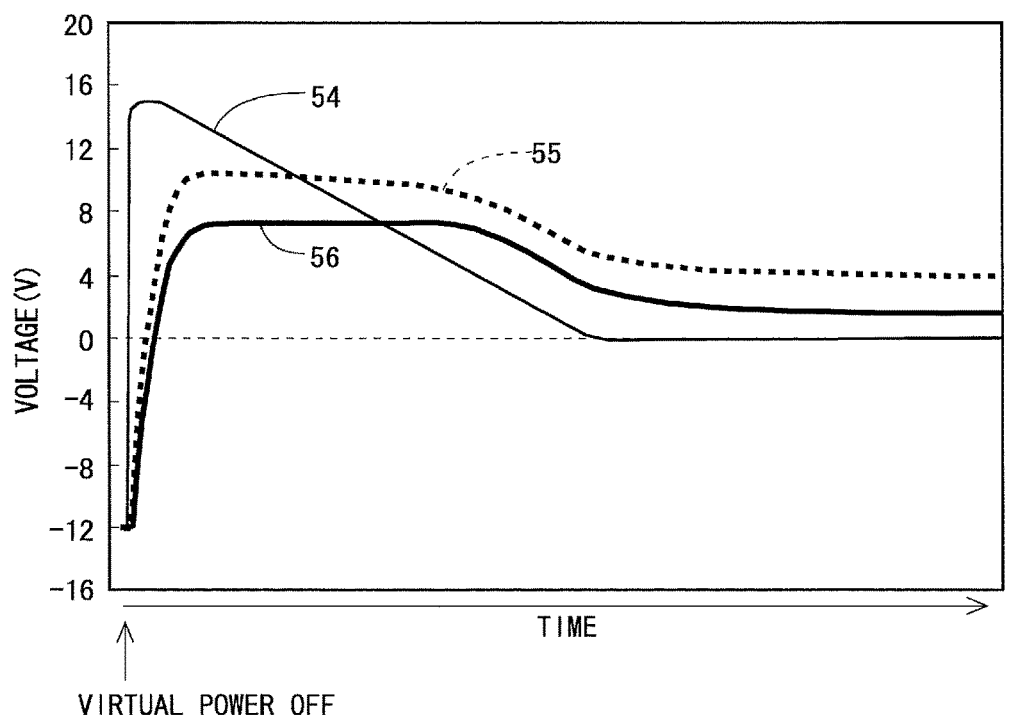
FIG. 13 is a diagram showing a simulation result of the second comparative example.

FIG. 13 is a diagram showing a simulation result of the second comparative example. It should be noted that FIG. 13 shows a voltage waveform change 54 of the gate clock signal GCK, a voltage waveform change 55 of the output control node netA, and a voltage waveform change 56 of the scanning signal Gout. According to the simulation result, the voltage of the scanning signal Gout is increased to high level immediately after the power is turned off in order to remove an electric charge within a pixel formation portion. Thereafter, the voltage of the scanning signal Gout is maintained at high level, and then gradually decreases. However, unlike the first comparative example, as can be seen from FIG. 13, the voltage of the scanning signal Gout does not reach the ground potential GND.

As described above, in a case in which the configuration of the unit circuit is conventional as shown in FIG. 9 and the single power supply system configuration is employed, an electric charge on the scanning line is not removed when the power supply is stopped. Therefore, display defect such as flicker may occur due to a residual charge when the power is turned on.

<4.2.3 Case of this Embodiment>

Figure 14:
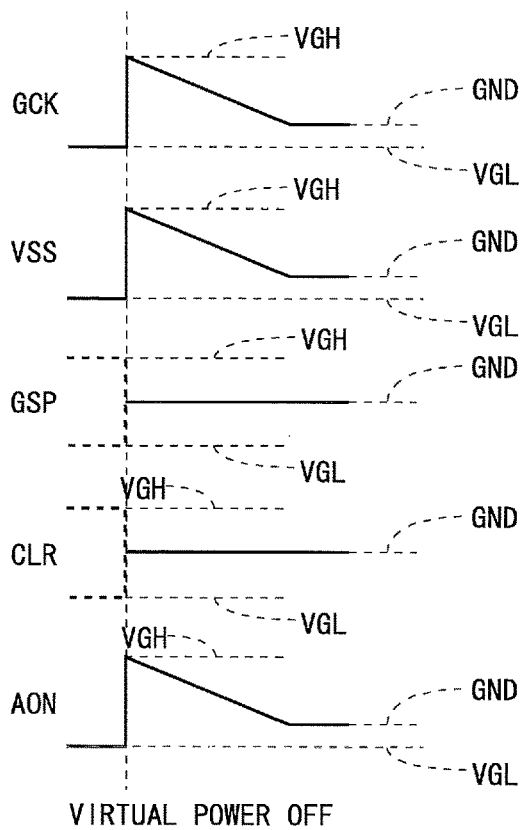
FIG. 14 is a waveform diagram showing five input signals used in the simulation according to the embodiment.

Regarding this embodiment, the single power supply system configuration is employed, and the simulation was carried by supplying the five input signals (the gate clock signal GCK, the reference voltage VSS, the gate start pulse signal GSP, the clear signal CLR, and the off control signal AON) whose voltage waveforms change as shown in FIG. 14 to the gate driver 24 including the shift register 240 constituted by the unit circuits 4 having the configuration shown in FIG. 1.

Figure 15:
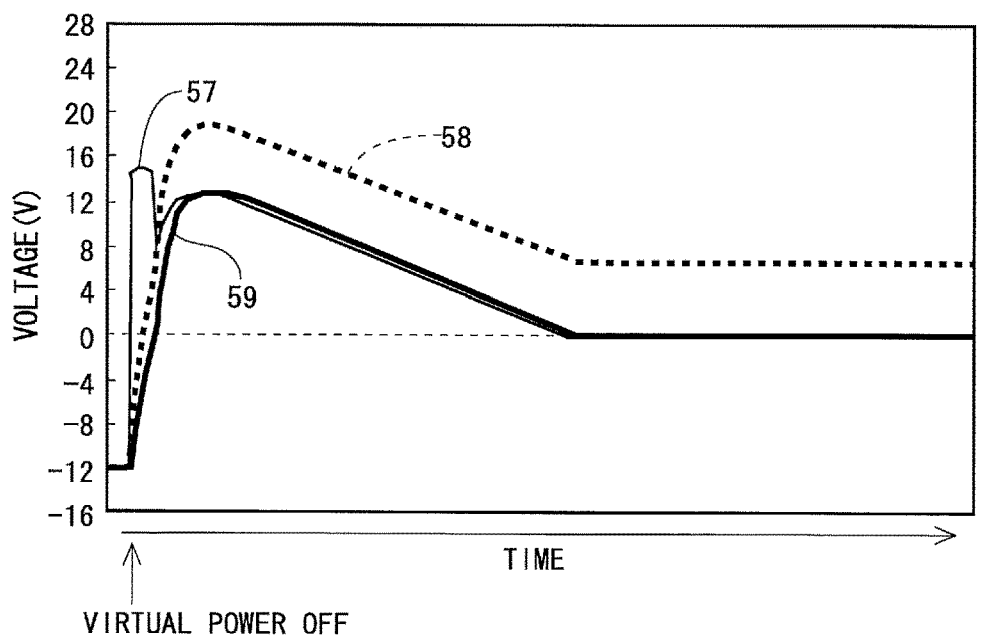
FIG. 15 is a diagram showing a simulation result according to the embodiment.

FIG. 15 is a diagram showing a simulation result according to this embodiment. It should be noted that FIG. 15 shows a voltage waveform change 57 of the gate clock signal GCK, a voltage waveform change 58 of the output control node netA, and a voltage waveform change 59 of the scanning signal Gout. According to the simulation result, the voltage of the scanning signal Gout is increased to high level immediately after the power is turned off in order to remove an electric charge within a pixel formation portion. The voltage of the output control node netA is increased to a level even higher than the voltage of the scanning signal Gout immediately after the power is turned off.

Here, the reason why the voltage of the output control node netA becomes higher than the voltage of the scanning signal Gout immediately after the power is turned off will be described. A dedicated line is used to transmit the off control signal AON as described above, and a load for this line is low. Accordingly, immediately after the power is turned off, the off control signal AON out of the five input signals rises first. With this, first, the output control node netA is charged via the thin film transistor T11. Subsequently, the scanning line GL is charged via the thin film transistor T10. Based on such transition, the voltage of the output control node netA becomes higher than the voltage of the scanning signal Gout immediately after the signals rise. Further even after charging of the scanning line GL ends, the output control node netA is excessively charged as the capacitor CAP is provided in the unit circuit 4. From the above, the voltage of the output control node netA becomes higher than the voltage of the scanning signal Gout.

As shown in FIG. 15, after the voltage of the scanning signal Gout reaches high level, it decreases as the voltage of the gate clock signal GCK decreases. Then, after a lapse of a predetermined time period from the time of power-off, the voltage of the scanning signal Gout reaches the ground potential GND.

Also from the above simulation result, it can be seen that, according to this embodiment, an electric charge within the pixel formation portions and an electric charge on the scanning lines GL are removed when the power supply is stopped.

Figure 16:
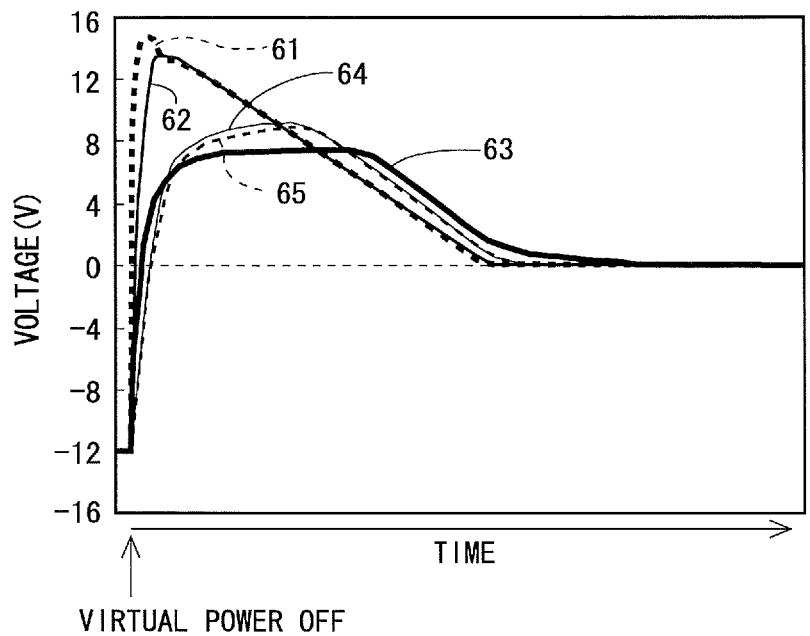
FIG. 16 is a waveform diagram for illustration of setting a voltage of a gate start pulse signal and a voltage of a clear signal to a ground potential when the power supply is stopped according to the embodiment.
Figure 17:
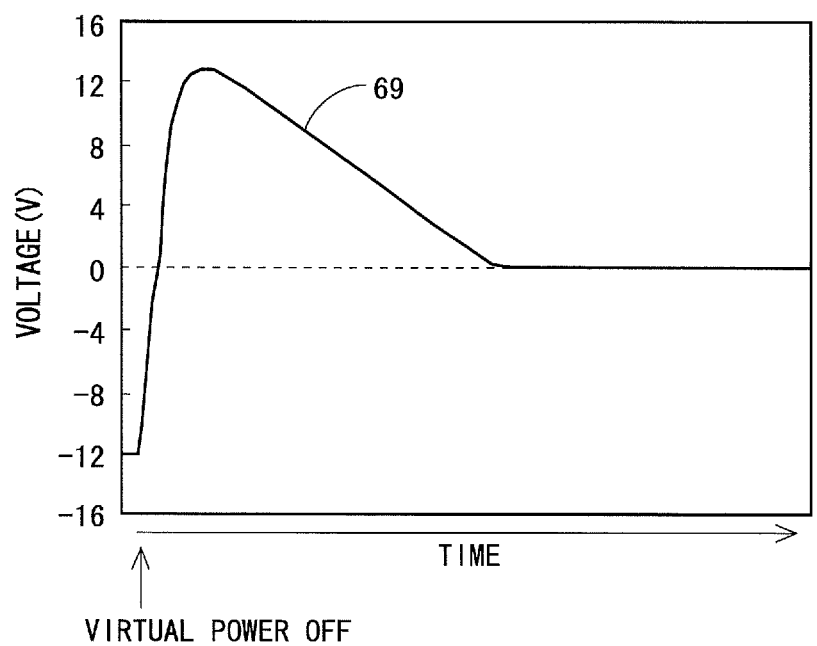
FIG. 17 is a waveform diagram for illustration of setting a voltage of the gate start pulse signal and a voltage of the clear signal to the ground potential when the power supply is stopped according to the embodiment.

In the meantime, according to this embodiment, when the power supply is stopped, the voltage of the gate start pulse signal GSP and the voltage of the clear signal CLR are set to the ground potential GND (see FIG. 14). In this regard, if the voltage of the gate start pulse signal GSP and the voltage of the clear signal CLR are not set to the ground potential GND when the power supply is stopped, the waveform of the scanning signal Gout differs from row to row as shown in FIG. 16. It should be noted that, in FIG. 16, voltage waveforms of the scanning signals Gout(1)-Gout(5) supplied to the scanning lines GL(1)-GL(5) from the first to the fifth row are respectively indicated by reference numerals 61-65. In contrast, if the voltage of the gate start pulse signal GSP and the voltage of the clear signal CLR are set to the ground potential GND when the power supply is stopped, regarding all rows, the voltage waveform of the scanning signal Gout is as indicated by a reference numeral 69 shown in FIG. 17. Specifically, the voltage waveform of the scanning signal Gout for every row changes in the same manner.

It should be noted that, according to this embodiment, a residual charge may occur at the output control node netA. In this regard, according to a current manufacturing process of IGZO-TFTs, the mobility is becoming higher and the threshold shift is further reduced. Accordingly, the threshold shift of the thin film transistor T10 (see FIG. 1) due to residual charge produced at the output control node netA is substantially close to 0 when the single power supply system configuration is employed, and the residual charge hardly affects the shift operation of the shift register 240.

<5. Effects>

According to this embodiment, each of the unit circuits 4 that constitute the shift register 240 within the gate driver 24 is provided with the thin film transistor T11 having a source terminal connected to the output control node netA, in addition to the conventional components. Regarding the thin film transistor T11, the off control signal AON is supplied to the gate terminal, and the reference voltage VSS is supplied to the drain terminal. In such a configuration, when the external power supply is stopped, the voltage of the off control signal AON and the reference voltage VSS are set to the gate on voltage VGH. Accordingly, after the power supply is stopped, an electric charge is supplied to the output control node netA via the thin film transistor T11, and therefore the thin film transistor T10 is maintained at the on state for a period longer than that in the conventional technique. With this, in each of the unit circuits 4, the voltage at the output terminal 49 reliably decreases as the voltage at the input terminal 41 decreases. Specifically, the voltage of the scanning signal Gout reliably decreases as the voltage of the gate clock signal GCK decreases. As a result, after the power supply is stopped, the voltage of the scanning signal Gout reaches the ground potential GND within a desired period of time. From the above, when the power supply is stopped, a residual charge within the pixel formation portion and a residual charge on the scanning line GL do not occur. Here, in this embodiment, the configuration in which only one kind of gate on voltage VGH is used as the voltage for turning the scanning lines GL to the selected state (single power supply system configuration) is employed. Accordingly, it is possible to realize the liquid crystal display device at lower cost as compared to a case where the dual power supply system configuration is employed. As described above, according to this embodiment, it is possible to realize a low-cost liquid crystal display device using IGZO-TFT and capable of suppressing occurrence of display defects due to residual charges.

<6. Modified Example>

Figure 18:
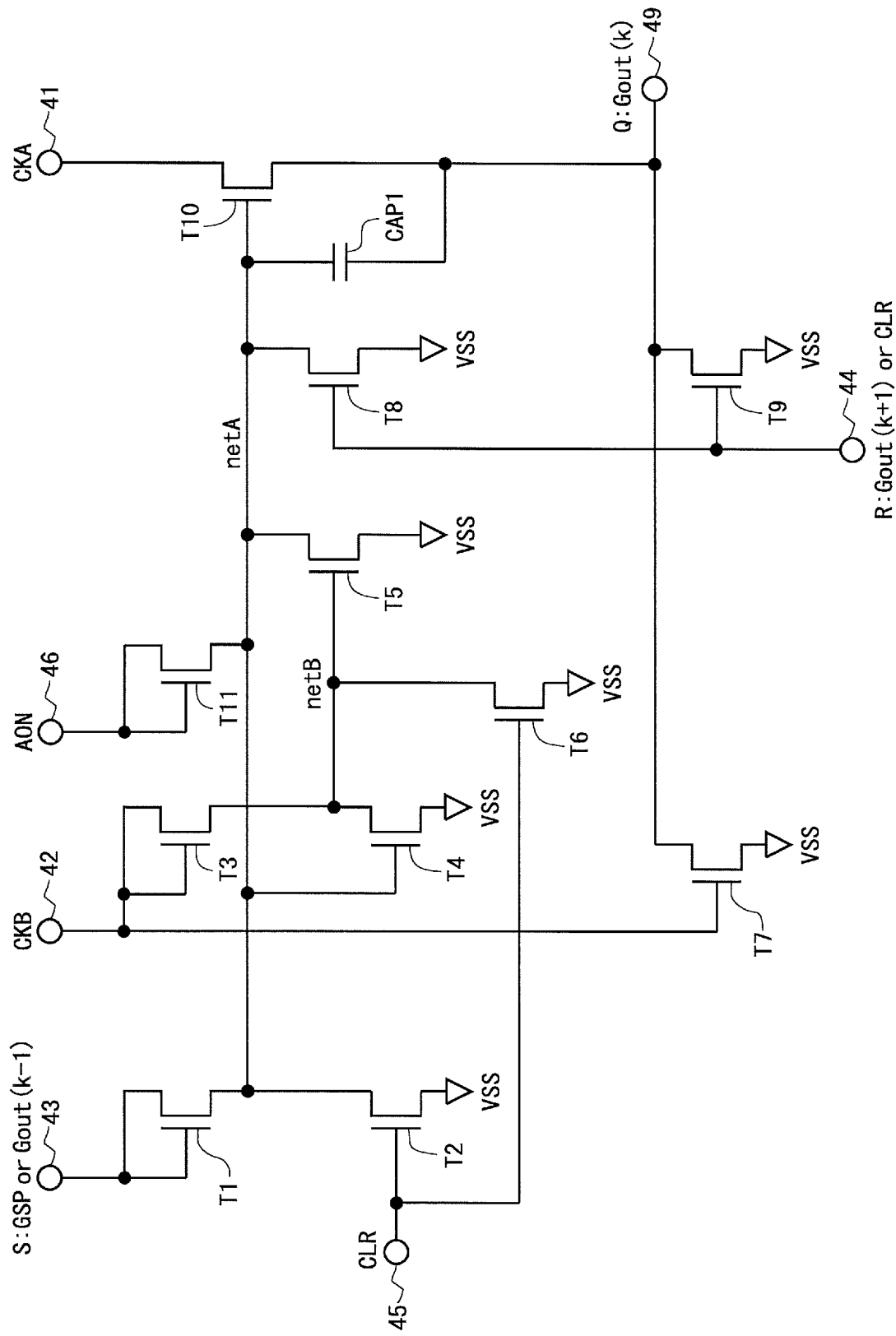
FIG. 18 is a circuit diagram illustrating a configuration of a unit circuit according to a modified example of the embodiment.

A modified example of the above embodiment will be described. FIG. 18 is a circuit diagram illustrating a configuration of the unit circuit 4 according to this modified example. In the above embodiment, the drain terminal of the thin film transistor T11 within the unit circuit 4 is connected to the reference voltage line. In contrast, in this modified example, the drain terminal of the thin film transistor T11 is, similarly to the gate terminal, connected to the input terminal 46 to which the off control signal AON is supplied. Specifically, in this modified example, the thin film transistor T11 having a diode-connected configuration is used.

In such a configuration, also in this modified example, the voltage of the off control signal AON is set to the gate on voltage VGH when the power supply is stopped. Accordingly, after the power supply is stopped, the thin film transistor T11 is turned to the on state, and an electric charge is supplied to the output control node netA via the thin film transistor T11. As a result, also in this modified example, the voltage of the scanning signal Gout reaches the ground potential GND within a desired period of time after the power supply is stopped.

Figure 19:
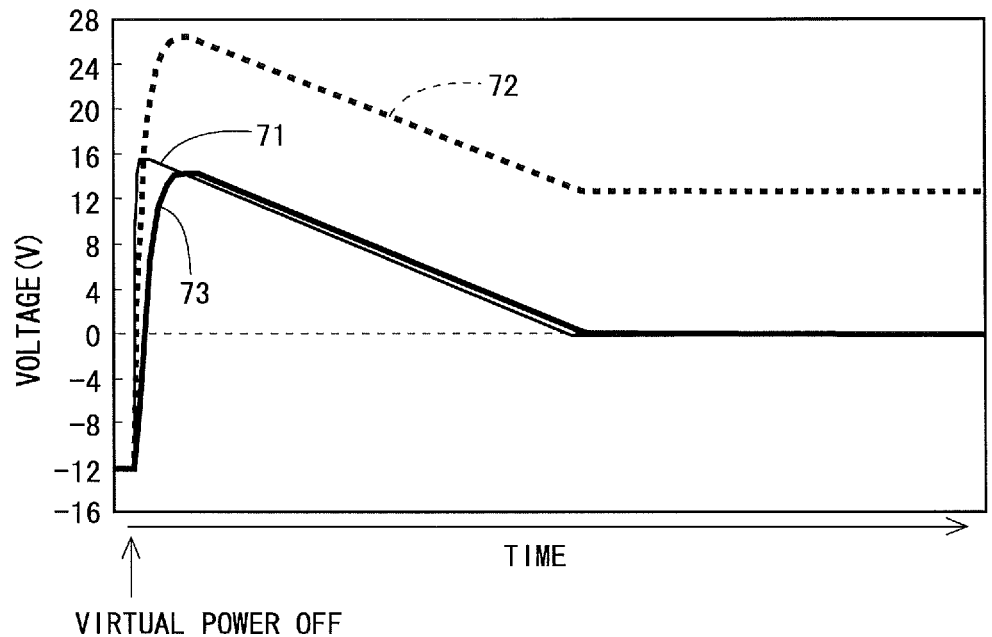
FIG. 19 is a diagram showing a simulation result according to the modified example of the embodiment.
Figure 20:
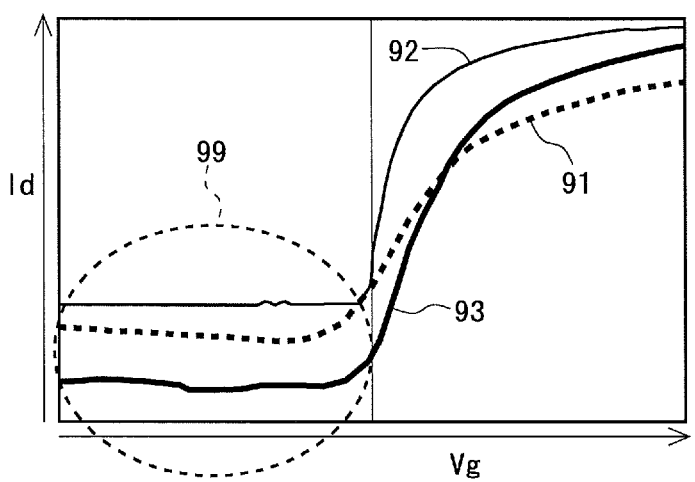
FIG. 20 is a diagram showing Vg-Id characteristics of a-SiTFT, a LTPS-TFT, and an IGZO-TFT.
Figure 21:
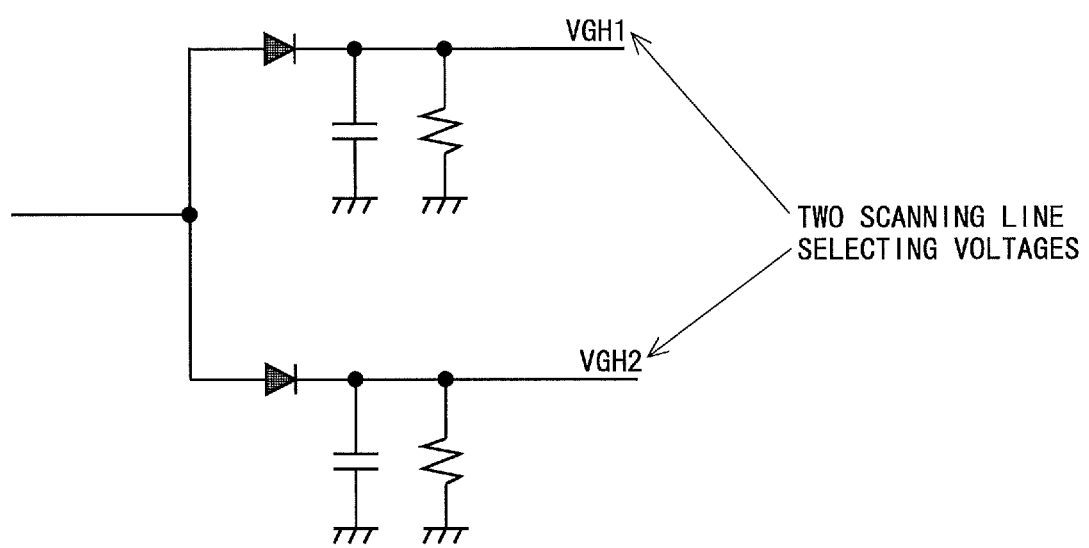
FIG. 21 is a circuit diagram for illustration of a dual power supply system configuration.

FIG. 19 is a diagram showing a result of performing a simulation as in the above embodiment, using the configuration of this modified example. It should be noted that FIG. 19 shows a voltage waveform change 71 of the gate clock signal GCK, a voltage waveform change 72 of the output control node netA, and a voltage waveform change 73 of the scanning signal Gout. It can be seen from FIG. 19 that the same effect as in the above embodiment can be obtained also in this modified example. Specifically, it can be seen that an electric charge within the pixel formation portion and an electric charge on the scanning line GL are removed when the power supply is stopped also in this modified example.

In the meantime, the off control signal AON is transmitted from the level-shift circuit 13 to the unit circuits 4 within the gate driver 24 using a dedicated line. Therefore, a load for this line is very low. In contrast, a load for the reference voltage line for transmitting the reference voltage VSS is large, since this line is connected to many of the thin film transistors within the unit circuit 4 as can be seen from FIG. 1. From the above, as compared to the above embodiment in which the drain terminal of the thin film transistor T11 is connected to the reference voltage line, the thin film transistor T11 becomes the on state more quickly with this modified example in which the drain terminal of the thin film transistor T11 is connected to the line for the off control signal AON. Specifically, according to this modified example, it is possible to charge the output control node netA at a faster pace when the power supply is turned off. Therefore, by employing the configuration according to this modified example, it is possible to cause the voltage of the scanning signal Gout to reliably reach the ground potential GND within a desired period of time after the power supply is stopped even when a large-sized panel is used.

<7. Others>

The present invention is not limited to the embodiment and the modified example described above, and may be implemented with various modifications without departing the spirit of the present invention. For example, although the TGZO-TFT is used as the thin film transistor in the above embodiment, other types of oxide TFT may be used. It should be noted that the effect of the present invention is particularly notable when a transistor whose off leakage current is one tenth or smaller than that of a thin film transistor whose channel layer is made of low-temperature polysilicon. Further, although the example in which an n-channel type TFT is used is described according to the above embodiment, a p-channel type TFT may be used. Further, the present invention is not limited to the liquid crystal display devices, and may be applied to other types of display devices capable of holding an electric charge in the pixel formation portion.

While the present invention has been described in detail in the above, the above description is only exemplary and illustrative, and not restrictive by any means. It is appreciated that a numerous number of variations and modifications may be conceivable without departing the scope of the present invention.

The present application claims priority to Japanese Patent Application No. 2018-18162 filed on Feb. 6, 2018, entitled "Display Device", which is herein incorporated by reference in its entirety.

What is claimed is:

1. A display device comprising:
   a display panel including a plurality of scanning lines and a scanning line drive circuit, the plurality of scanning lines being connected respectively to a plurality of pixel formation portions, the scanning line drive circuit selectively driving the plurality of scanning lines;
   a voltage generation circuit configured to receive external power supply and generate one kind of scanning line selecting voltage and one kind of scanning line unselecting voltage, the scanning line selecting voltage being a voltage for turning the scanning lines to a selected state, the scanning line unselecting voltage being a voltage for turning the scanning lines to an unselected state; and
   a drive control circuit configured to control an operation of the scanning line drive circuit using the scanning line selecting voltage and the scanning line unselecting voltage which are generated by the voltage generation circuit, wherein
   the scanning line drive circuit includes a shift register including a plurality of unit circuits provided so as to respectively correspond to the plurality of scanning lines, the shift register being configured to perform a shift operation based on a plurality of clock signals,
   each of the plurality of unit circuits includes:
      an output node connected to a corresponding scanning line;
      an output control transistor having a control terminal, a first conducting terminal to which one of the plurality of clock signals is supplied, and a second conducting terminal connected to the output node;
      an output control node connected to the control terminal of the output control transistor; and
      an off control transistor having a control terminal, a first conducting terminal, and a second conducting terminal connected to the output control node, in normal times, the drive control circuit sets a voltage of the plurality of clock signals to the scanning line selecting voltage and the scanning line unselecting voltage alternatingly, and sets a voltage supplied to the control terminal of the off control transistor and a voltage supplied to the first conducting terminal of the off control transistor to the scanning line unselecting voltage, when the power supply is stopped, the drive control circuit sets the voltage of the plurality of clock signals, the voltage supplied to the control terminal of the off control transistor, and the voltage supplied to the first conducting terminal of the off control transistor to the scanning line selecting voltage, an off control signal outputted from the drive control circuit is supplied to the control terminal of the off control transistor via a dedicated line, and the drive control circuit sets the off control signal to the scanning line unselecting voltage in normal times, and sets the off control signal to the scanning line selecting voltage when the power supply is stopped.

2. The display device according to claim 1, wherein the off control signal is supplied to the first conducting terminal of the off control transistor.

3. The display device according to claim 1, wherein a reference voltage outputted from the drive control circuit and serving as a reference of the operation of the scanning line drive circuit is supplied to the first conducting terminal of the off control transistor, and the drive control circuit sets the reference voltage to the scanning line unselecting voltage in normal times, and sets the reference voltage to the scanning line selecting voltage when the power supply is stopped.

4. The display device according to claim 1, wherein a capacitor and a resistor are connected to a line for supplying the scanning line selecting voltage from the voltage generation circuit to the drive control circuit.

5. The display device according to claim 1, wherein the display panel includes a plurality of transistors including the output control transistor and the off control transistor, and an off leakage current in at least a part of the plurality of transistors is one tenth or smaller than that in a thin film transistor whose channel layer is made of low-temperature polysilicon.

6. The display device according to claim 5, wherein at least a part of the plurality of transistors is a thin film transistor whose channel layer is made of indium gallium zinc oxide.

7. The display device according to claim 1, wherein when the power supply is stopped, after an electric charge accumulated in each of the plurality of pixel formation portions is discharged, a voltage of each of the plurality of scanning lines reaches a ground potential.

* * * * *